United States Patent
Lai et al.

(10) Patent No.: US 7,240,722 B2
(45) Date of Patent: Jul. 10, 2007

(54) HEAT DISSIPATION DEVICE

(75) Inventors: Cheng-Tien Lai, Guangdong (CN); Zhi-Yong Zhou, Guangdong (CN); Jiang-Jian Wen, Guangdong (CN)

(73) Assignees: Fu Zhun Precision Industry (Shen Zhen) Co., Ltd., Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/164,282

(22) Filed: Nov. 17, 2005

(65) Prior Publication Data

US 2006/0278372 A1    Dec. 14, 2006

(30) Foreign Application Priority Data

Jun. 8, 2005   (CN) .................... 2005 1 0035227

(51) Int. Cl.
*F28D 15/00* (2006.01)
*F28F 7/00* (2006.01)

(52) U.S. Cl. .............. 165/104.33; 165/104.21; 165/80.4

(58) Field of Classification Search ........... 165/80.3, 165/185, 104.21, 104.33, 104.34, 80.4; 361/697, 361/699, 700, 702, 704; 257/704, 705; 174/15.2
See application file for complete search history.

(56) References Cited

U.S. PATENT DOCUMENTS

| | | | | |
|---|---|---|---|---|
| 4,381,032 | A | * | 4/1983 | Cutchaw ..................... 165/46 |
| 6,102,110 | A | * | 8/2000 | Julien et al. ........... 165/104.33 |
| 6,657,121 | B2 | * | 12/2003 | Garner ...................... 174/16.3 |
| 6,697,253 | B2 | | 2/2004 | Minamitani et al. |
| 6,778,394 | B2 | * | 8/2004 | Oikawa et al. ............. 361/700 |
| 6,877,318 | B2 | * | 4/2005 | Tadayon et al. ............ 60/651 |
| 6,940,717 | B2 | | 9/2005 | Shih-Tsung |
| 2004/0079100 | A1 | * | 4/2004 | Monfarad ................. 62/259.2 |
| 2005/0145371 | A1 | * | 7/2005 | DiStefano et al. ...... 165/104.21 |
| 2005/0263265 | A1 | * | 12/2005 | Sheng et al. ........... 165/104.21 |

FOREIGN PATENT DOCUMENTS

JP       08279577 A   * 10/1996

* cited by examiner

*Primary Examiner*—Tho Duong
(74) *Attorney, Agent, or Firm*—Winston Hsu

(57) ABSTRACT

A heat dissipation device includes a liquid cooling system and a heat exchanger. The liquid cooling system includes a cold plate (20) having an inlet (244) and an outlet (246) to permit liquid to flow through the cold plate. The heat exchanger includes a heat conductive member (10) thermally connecting with the cold plate to fins (60).

7 Claims, 5 Drawing Sheets

HEAT DISSIPATION DEVICE

FIELD OF THE INVENTION

The present invention relates generally to a heat dissipation device, and more particularly to a heat dissipation device using a liquid cooling system combined with a heat pipe for removing heat from an electronic component.

DESCRIPTION OF RELATED ART

Over the past few years, CPU speeds have been increasing at a dramatic rate. In order to speedily process more information, CPUs have more transistors, consume more power and have higher clock rates. This leads to more heat produced by the CPU in the computer. The heat can accumulate and generate unacceptable high temperature and thermal stress on the CPU, resulting in reliability performance degradation and system malfunction. Heat sinks have been added to all modern PC CPUs to help try to dissipate some of the heat from the CPUs into the surrounding environment. However the conventional heat sinks cannot meet the increasingly demanding requirement of heat dissipation. Liquid cooling is developed as new solution of the heat dissipation of the CPUs.

A liquid cooling system circulates a liquid through a cold plate attached to the CPU inside of the computer. As the liquid passes through the cold plate, heat is transferred from the hot CPU to the cooler liquid. The hot liquid then moves out to a heat sink at a proper place and transfers the heat to the ambient air flowing through the heat sink. The cooled liquid then travels back through the system to the CPU to continue the cooling process. A typical liquid cooling system generally comprises a cold plate, a pump, a heat sink, a tube extending through the pump and the heat sink and connecting with an inlet and an outlet of the cold plate. The pump draws the working liquid from the cold plate via the outlet thereof and the tube, and supplies the working liquid back to the cold plate via the inlet thereof and the tube. The liquid flows through the heat sink whereby heat in the liquid is absorbed by the heat sink.

Another approach to cool down a CPU is to use a heat pipe assembly. Generally, the heat pipe assembly comprises a heat sink and a heat pipe. The heat sink comprises a base and a plurality of fins extending from the base. The base defines a groove in the top surface thereof, and bottom surface of the base is attached to the CPU. Each heat pipe has an evaporating portion accommodated in the groove and a condensing portion inserted in the fins. The base absorbs heat produced by the CPU and transfers the heat directly to the fins through the heat pipe.

However, each of the liquid cooling system and the heat pipe assembly only use a single cooling fashion to cool down the CPU. If one component, such as the pump of the liquid cooling system, or the heat pipe of the heat pipe assembly, fails to work, the cooling device can not remove heat from the CPU any longer. The heat will be accumulated on and overheat the CPU, resulting in degradation of reliability and system malfunction.

What is needed, therefore, is a heat dissipation device which has a high reliability to make sure that the heat of the CPU can still be dissipated even if one component of the heat dissipation device cannot work normally.

SUMMARY OF INVENTION

A heat dissipation device comprises a liquid cooling system and a heat exchanger. The liquid cooling system comprises a cold plate having an inlet and an outlet to permit liquid to flow through the cold plate. The heat exchanger comprises a heat conductive member thermally connecting with the cold plate. The liquid cooling system and the heat exchanger are arranged to independently thermally connect a heat-generating electronic component to be cooled by the heat dissipation device.

Other advantages and novel features will become more apparent from the following detailed description of preferred embodiments when taken in conjunction with the accompanying drawings, in which:

DETAILED DESCRIPTION

Figure 1:
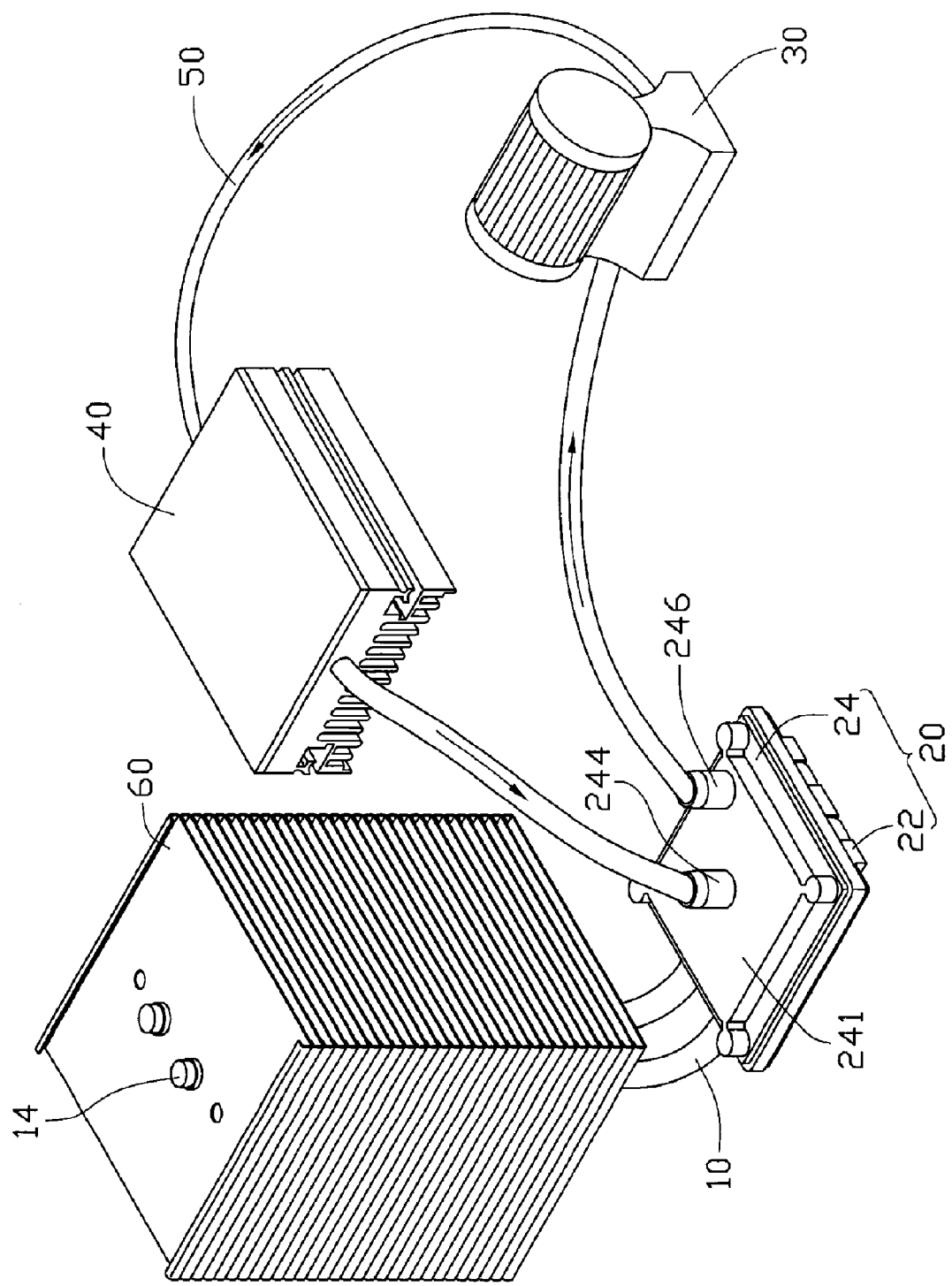
FIG. 1 is an assembled view of a heat dissipation device in accordance with a preferred embodiment of the present invention.
Figure 2:
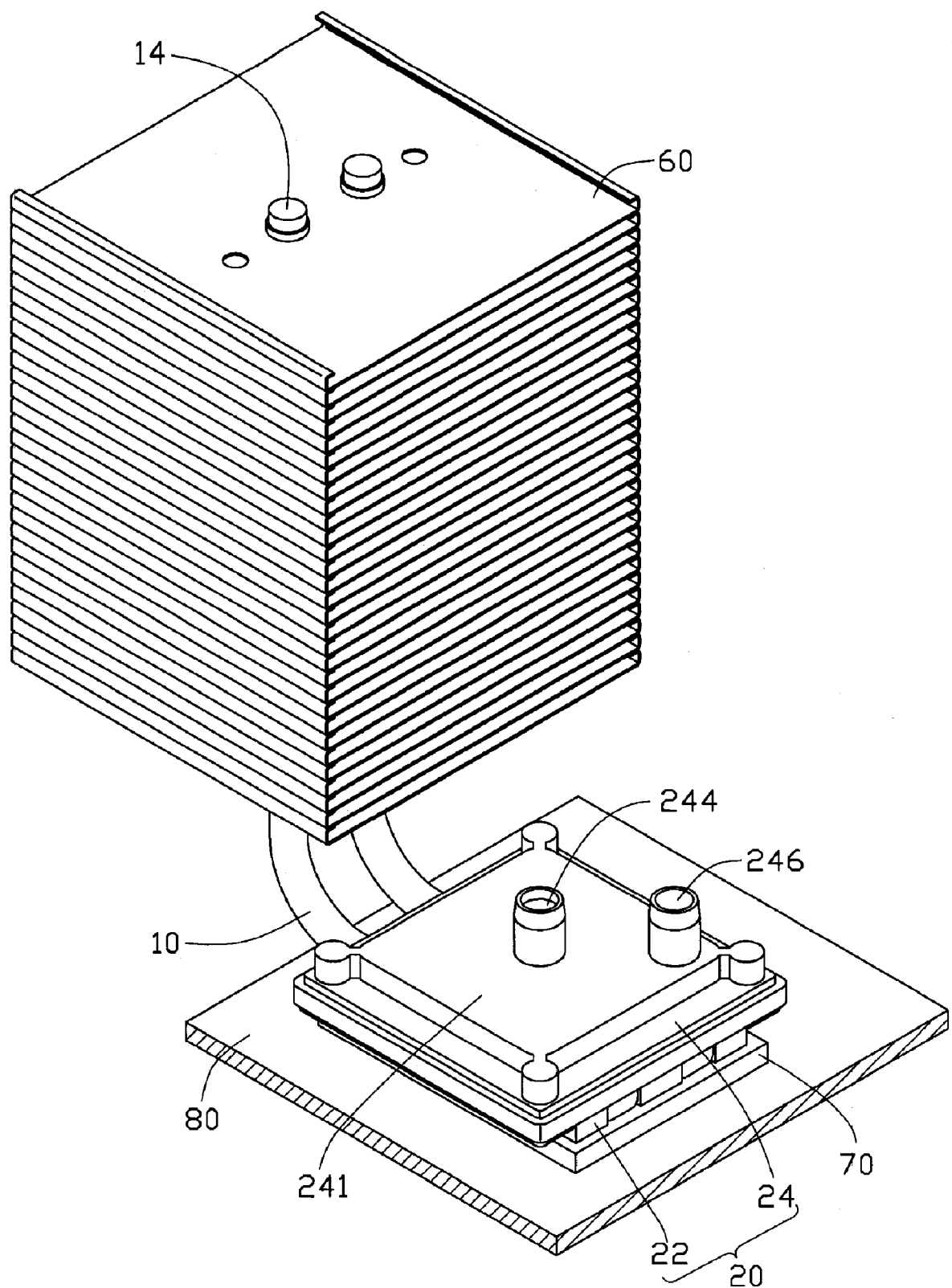
FIG. 2 is an enlarged view of a cold plate and heat pipes combined with a plurality of fins of the heat dissipation device of FIG. 1, the cold plate being attached to an electronic component mounted on a printed circuit board.
Figure 3:
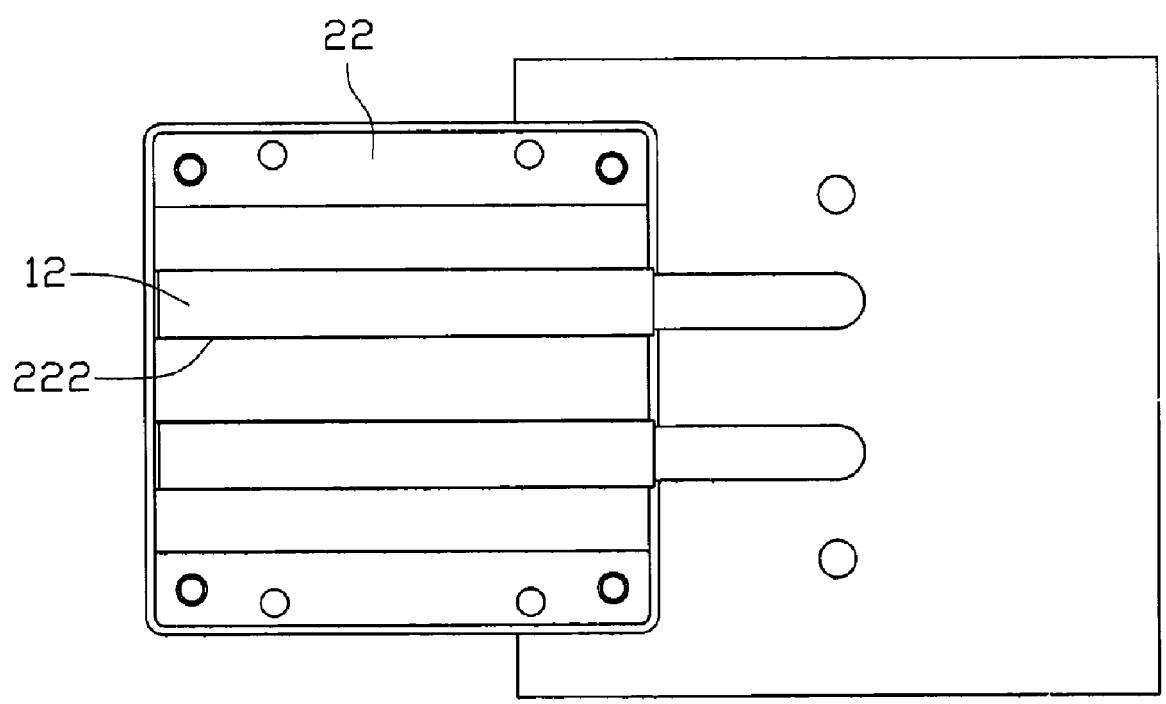
FIG. 3 is similar to FIG. 2, but viewed from a bottom of the cold plate, and the printed circuit board and the electronic component are removed.
Figure 4:
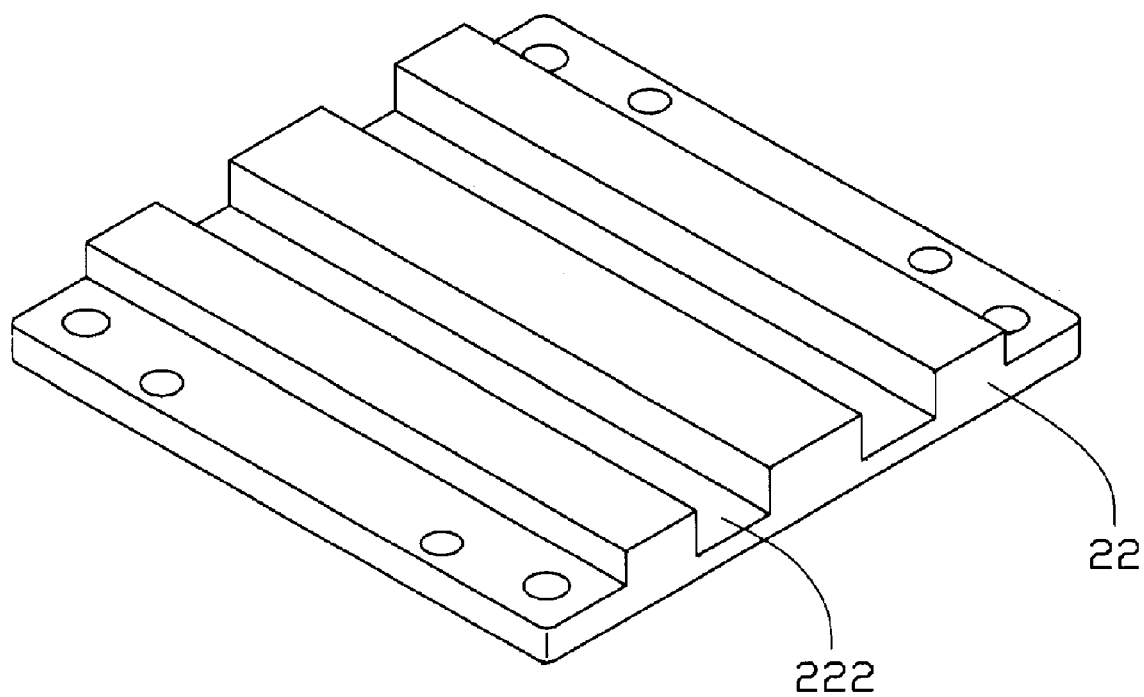
FIG. 4 is an enlarged view of a base of the cold plate of FIG. 2.
Figure 5:
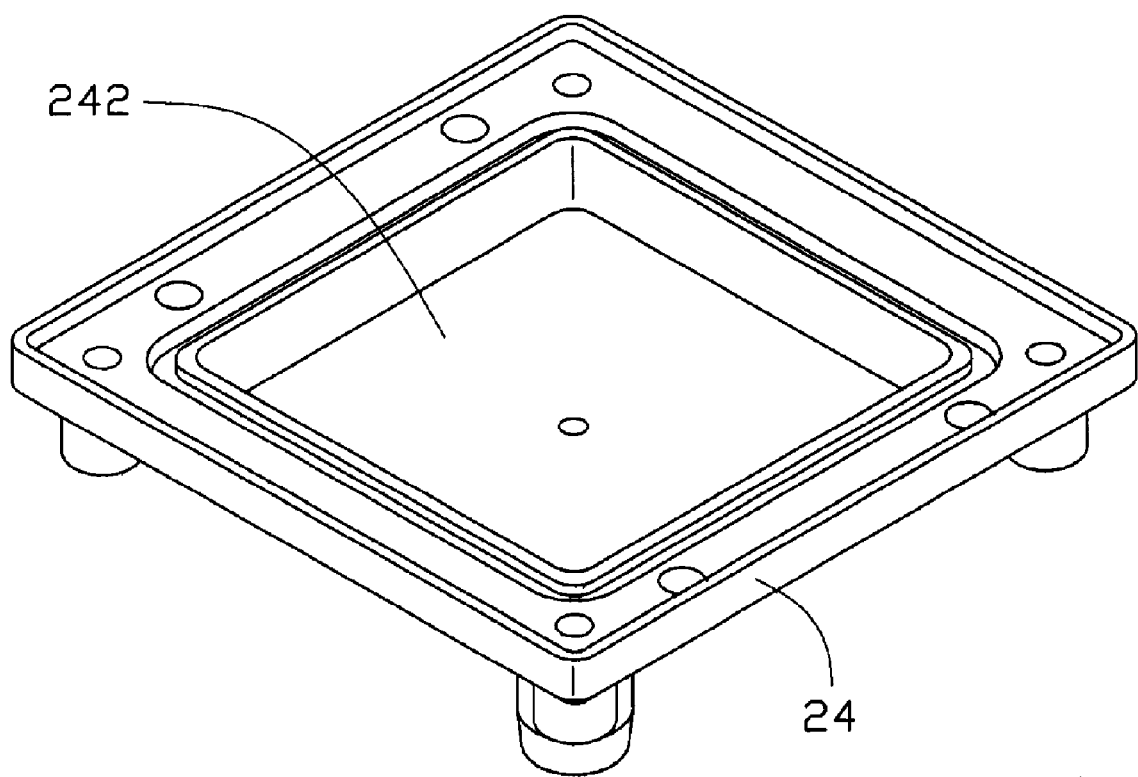
FIG. 5 is an enlarged view of a cover of the cold plate of FIG. 2.

Referring to FIG. 1, a heat dissipation device of a preferred embodiment of the invention comprises a liquid cooling system and a heat exchanger. The heat exchanger comprises a heat conductive member such as two heat pipes 10, and a plurality of fins 60 transverse to and in fixed contact with the heat pipes 10. The liquid cooling system comprises a hollow cold plate 20, a pump 30, a heat sink 40, and tubes 50, wherein the cold plate 20, the pump 30, the heat sink 40 and the tubes 50 together form a loop for circulation of liquid.

Also referring to FIGS. 2-5, the cold plate 20 comprises a base 22 with two grooves 222 defined therein (clearly seen in FIG. 4) and a cover 24 hermetically mounted on the base 22. A protrusion 241 projects upwardly from the cover 24 and a cavity 242 is defined in the protrusion 241 of the cover 24 (clearly seen in FIG. 5). The cavity 242 serves as a liquid container when the cover 24 and the base 22 are assembled together to form the cold plate 20. The cover 24 further comprises an inlet 244 and an outlet 246 projected upwardly from the protrusion 241 and connected with the tubes 50 to permit the liquid to flow through the cold plate 20. In the preferred embodiment, the inlet 244 is disposed in a central portion of the protrusion 241 so that the liquid cooled by the heat sink 40 can directly impinge on a central portion of the base 22.

Each heat pipe 10 comprises an evaporator 12 and a condenser 14 opposite the evaporator 12. The evaporators 12 of the heat pipes 10 are accommodated in the grooves 222 defined in the base 22 and the condensers 14 are oriented substantially perpendicular to the base 22 and the evaporator 12. The base 22 and the evaporators 12 of the heat pipes 10 together form a flat bottom surface for thermally contacting an electronic component 70 mounted on a printed circuit board 80. The electronic component 70 is a heat-generating electronic component, such as a CPU. The fins 60 are mounted on the condenser 14 of each heat pipe 10 to cool the condenser 14 of the heat pipe 10. In the preferred embodiment, the heat pipes 10 are L-shaped. However, the heat pipes 10 are not limited to be L-shaped as described in the preferred embodiment, other shaped heat pipes such as U-shaped, or straight heat pipes are also feasible to be used in the heat dissipation device.

In work of the heat dissipation device, heat originated from the electronic component 70 is absorbed by the base 22 of the cold plate 20 and the evaporators 12 of the heat pipes 10 simultaneously. The heat absorbed by the evaporators 12 of the heat pipes 10 is mainly conveyed to the condensers 14 distant from the evaporators 12, and then conducted to the fins 60 to be dissipated. The heat absorbed by the base 22 is conducted to the liquid contained in the cavity 242 of the cold plate 20. The pump 30 drives the liquid to circulate through the cold plate 20, the tubes 50 and the heat sink 40. Thus, the heat absorbed by the base 22 is transferred to the heat sink 40 and dissipated to the ambient air.

In the preferred embodiment, the liquid cooling system and the heat pipes 10 combined with the fins 60 together cool down the same electronic component 70 in different fashions and in separate heat-transfer paths. Therefore, the heat can be quickly and efficiently removed away from the electronic component 70. Additionally, if the heat dissipation device fails to transfer heat in one of the heat-transfer paths, the heat dissipation device can still work because the other heat-transfer path can still function to dissipate the heat of the electronic component 70. By such design of parallel heat-transfer paths, the present invention can very reliably prevent the electronic component 70 from being damaged due to rapidly raising temperature thereof. Therefore, the reliability of the heat dissipation device and the electronic component 70 as a whole is improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a liquid cooling system comprising a cold plate, the cold plate comprising an inlet and an outlet to permit liquid to flow through the cold plate, and a groove defined in a bottom side of the cold plate, wherein the cold plate comprises a base and a cover hermetically mounted on one side of the base and wherein the groove is defined in another side of the base opposite to the cover; and
a heat exchanger comprising a heat conductive member with a part thereof accommodated in the groove of the cold plate;
wherein the cover comprises a protrusion extending from a central portion thereof toward a direction away from the base, wherein a cavity is defined in the protrusion to form a liquid container when the cover and the base are assembled together to form the cold plate; and
wherein the inlet is disposed in a central portion of the protrusion of the cover, and the inlet extends along a direction away from the protrusion of the cover perpendicular to the base of the cold plate.

2. The heat dissipation device as claimed in claim 1, wherein the heat exchanger further comprises a plurality of fins, the heat conductive member thermally connecting the cold plate and the fins together.

3. The heat dissipation device as claimed in claim 1, wherein the heat conductive member comprises a heat pipe, and the heat pipe comprises an evaporator accommodated in the groove and a condenser extending from the evaporator.

4. The heat dissipation device as claimed in claim 3, wherein the condenser of the heat pipe is substantially perpendicular to the base and is transverse to and in fixed contact with the fins.

5. The heat dissipation device as claimed in claim 1, wherein the inlet and the outlet are defined in the protrusion.

6. The heat dissipation device as claimed in claim 1, wherein the heat conductive member comprises a heat pipe, and the heat pipe comprises an evaporator accommodated in the groove and a condenser extending from the evaporator extending along a direction parallel to the inlet.

7. The heat dissipation device as claimed in claim 6, wherein the liquid flowing into the cold plate via the inlet directly impinges on a central portion of the base.

* * * * *